United States Patent [19]

Iwasaki et al.

[11] Patent Number: 4,925,768
[45] Date of Patent: May 15, 1990

[54] PHOTOPOLYMERIZABLE COMPOSITION CONTAINING A TETRAPOLYMER BINDER

[75] Inventors: Masayuki Iwasaki; Sadao Fujikura; Yuichi Wakata; Yasunori Takata, all of Shizuoka, Japan

[73] Assignee: Fuji Photo Film Co., Ltd., Kanagawa, Japan

[21] Appl. No.: 364,599

[22] Filed: Jun. 12, 1989

Related U.S. Application Data

[63] Continuation-in-part of Ser. No. 131,685, Dec. 11, 1987, abandoned.

[30] Foreign Application Priority Data

Dec. 11, 1986 [JP] Japan .................. 61-295441

[51] Int. Cl.$^5$ .............................. G03C 1/76
[52] U.S. Cl. ..................... 430/271; 430/281; 430/300; 430/905; 430/910
[58] Field of Search ............... 430/271, 281, 300, 910, 430/905

[56] References Cited

U.S. PATENT DOCUMENTS 4,139,391 2/1979 Ikeda et al. .
4,284,707 8/1981 Nagasawa et al. .................. 430/910
4,629,680 12/1986 Iwasaki et al. ..................... 430/181

FOREIGN PATENT DOCUMENTS 58-1142 1/1983 Japan .

Primary Examiner—Jack P. Brammer
Attorney, Agent, or Firm—Sughrue, Mion, Zinn, Macpeak & Seas

[57] ABSTRACT

A photopolymerizable composition comprising an addition polymerizable unsaturated compound having at least two ethylenically unsaturated double bonds in the molecule, a photopolymerization initiator, and a binder, wherein the binder is a tetrapolymer having a weight average molecular weight of from 10,000 to 50,000 represented by formula (I):

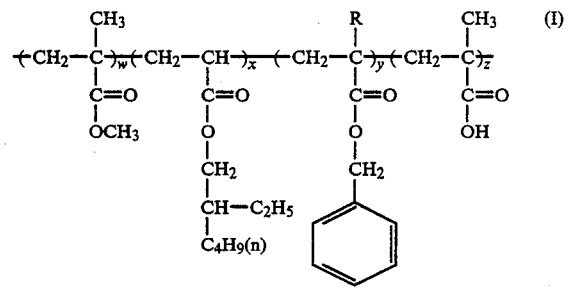

wherein R represents a hydrogen atom or a methyl group; and w, x, y and z each represents mol percent (mol %), w ranging from about 45 to 65; x ranging from about 5 to 18; y ranging from about 2 to 10; and z ranging from about 20 to 40 and where $C_4H_9(n)$ represents an n-butyl group. The photopolymerizable composition can be developed with a weakly alkaline aqueous solution, has sufficient flexibility to be laminated on a base as a dry film, high adhesiveness to a base and reduced surface tackiness. It resists cold flow during preservation, has excellent resistance to swelling by a developing solution after polymerization, and rapid releasability when treated with a dilute aqueous solution of a strong alkali containing no organic solvent, and forms an image faithful to the original with a high resolving power.

15 Claims, No Drawings

PHOTOPOLYMERIZABLE COMPOSITION CONTAINING A TETRAPOLYMER BINDER

This is a continuation-in-part of application Ser. No. 07/131,685, filed 12/11/87, now abandoned.

FIELD OF THE INVENTION

This invention relates to a novel photopolymerizable composition. More particularly, it relates to a photopolymerizable composition which can be developed with a weakly alkaline aqueous solution containing no organic solvent.

BACKGROUND OF THE INVENTION

Conventional photopolymerizable compositions have been developed with organic solvent developers. However, organic solvents are generally expensive, toxic, and combustible. Moreover, use of organic solvents entails enormous cost for industrial hygiene and countermeasures against environmental pollution. Photopolymerizable compositions which can be developed without using any organic solvents are therefore in great demand. In general, what determines solubility and other properties of photopolymerizable compositions is the binder component used therein.

Representative photopolymerizable compositions developable with an alkaline aqueous solution include those described in Japanese Patent Publication No. 14065/60 (polymers containing oxygen in the side chain are used as binder; hereinafter the compounds in the parentheses are binders used in the respective compositions), Japanese Patent Publication No. 32714/71 (corresponding to U.S. Pat. No. 3,458,311) (methyl methacrylate/methacrylic acid copolymers, etc.), Japanese Patent Publication No. 34327/79 (corresponding to U.S. Pat. No. 3,804,631) (methyl methacrylate/2-ethylhexyl methacrylate/methacrylic acid terpolymers, etc.), Japanese Patent Publication No. 38961/80 (corresponding to U.S. Pat. No. 3,953,309) (styrene/mono-n-butyl maleate copolymers, etc.), Japanese Patent Publication No. 33413/81 (corresponding to British Patent 1,425,423) (ethyl methacrylate/ethyl acrylate/methacrylic acid terpolymers, etc.), Japanese Patent Publication No. 25957/79 (styrene/methyl methacrylate/ethyl acrylate/methacrylic acid tetrapolymers, etc.), Japanese Patent Application (OPI) No. 99810/77 (the term "OPI" as used herein refers to a "published unexamined Japanese patent application") (corresponding to U.S. Pat. No. 4,139,391) (benzyl methacrylate/methacrylic acid copolymers, etc.), Japanese Patent Publication No.12577/83 (corresponding to U.S. Pat. No. 3,930,865) (acrylonitrile/2-ethylhexyl methacrylate/methacrylic acid terpolymers, etc.), Japanese Patent Publication No. 6210/80 (corresponding to U.S. Pat. No. 4,273,857) (methyl methacrylate/ethyl acrylate/acrylic acid terpolymers, or styrene/maleic anhydride copolymer partially esterified with isopropanol), Japanese Patent Application (OPI) No. 1142/83 (methyl methacrylate/methacrylic acid/2-ethylhexyl acrylate terpolymers or methacrylic acid/methyl methacrylate/2-ethylhexyl acrylate/n-butyl methacrylate tetrapolymers), Japanese Patent Application (OPI) No. 159743/85 (corresponding to U.S. Pat. No. 4,629,680) (cyclohexyl methacrylate/methyl acrylate/methacrylic acid/acrylic acid tetrapolymers), Japanese Patent Application (OPI) No. 258539/85 (corresponding to U.S. Pat. No. 4,629,680) (benzyl methacrylate/methyl acrylate/methacrylic acid/acrylic acid tetrapolymers), Japanese Patent Application (OPI) No. 169829/86 (corresponding to U.S. patent application Ser. No. 824,343) (benzyl methacrylate/methacrylic acid/acrylic acid terpolymers), and Japanese Patent Application (OPI) No. 213213/86 (benzyl acrylate/methyl methacrylate/methacrylic acid terpolymers).

Although these known alkali-developable photopolymerizable compositions have advantages in some applications, they involve disadvantages as set forth below when used in the production of photoresists.

Printed circuit boards can be produced by laminating a photosensitive solid film on a base, e.g., typically a copper-clad laminate base, under pressure as disclosed in Japanese Patent Publication No. 25231/70 (corresponding to U.S. Pat. No. 3,469,982). Photopolymerizable compositions suited for this technique are required to have well-balanced properties, such as developability, releasability (strippability) of a resist (the resist in a polymerized state should have resistance to an etching solution or a plating solution), low tackiness, high adhesion to a base, and flexibility. In this connection, the above-recited known polymerizable compositions have one or more disadvantages of excessive tackiness or brittleness, insufficient adhesion to a base or resistance to swelling for providing an image of high resolving power, long development time, and the like.

In addition, a dry film resist is sought which provides a resist line image faithful to the original and with high resolving power in order to satisfy the recent demand for high density printed wiring, but conventionally known photopolymerizable compositions developable with an alkaline aqueous solution cannot satisfy this requirement due to their lack of resistance to swelling by a developing solution and adhesion to a base.

SUMMARY OF THE INVENTION

An object of this invention is to provide a photopolymerizable composition developable with an alkaline aqueous solution which is free from the above-described disadvantages associated with conventional compositions.

That is, one object of this invention is to provide a photopolymerizable composition developable with a weakly alkaline aqueous solution, which has sufficient flexibility to be laminated on a base as a dry film, high adhesiveness to the base, reduced surface tackiness, sufficient hardness to prevent cold flow during preservation, excellent resistance to swelling by a developing solution after polymerization, and rapid strippability when treated with a dilute aqueous solution of a strong alkali containing no organic solvent.

Another object of this invention is to provide a photopolymerizable composition which forms a line image faithful to the original with a high resolving power.

As a result of extensive investigations, it has now been found that these and other objects of the present invention can be achieved by a photopolymerizable composition containing an addition polymerizable unsaturated compound having at least two ethylenically unsaturated double bonds in the molecule, a photopolymerization initiator, and a binder, wherein the binder is a tetrapolymer having a weight average molecular weight of from about 10,000 to 500,000 represented by formula (I):

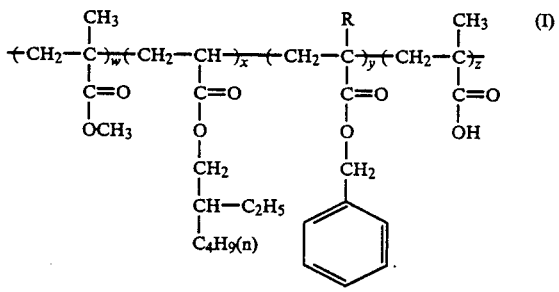

(I)

wherein R represents a hydrogen atom or a methyl group; and w, x, y and z each represents mol percent (mol%), w ranging from about 45 to 65, preferably 50 to 60; x ranging from about 5 to 18, preferably 8 to 15; y ranging from about 2 to 10, preferably 4 to 8; and z ranging from about 20 to 40, preferably 25 to 35 and where $C_4H_9(n)$ represents an n-butyl group, i.e., $-(CH_2)_3CH_3$.

DETAILED DESCRIPTION OF THE INVENTION

In the tetrapolymer of formula (I) used in the present invention, each of the repeating units is present within the ranges set forth in order to meet performance requirements of the binder.

That is, the methyl methacrylate unit is a component contributing to hardness of an unexposed photosensitive layer and resistance of an exposed area to chemicals, such as an alkaline developing solution, an etching solution, a plating solution, and the like, and is present in the proportion of from about 45 to 65 mol%.

The 2-ethylhexyl acrylate unit is present in the proper proportion to impart softness to an unexposed photosensitive layer. If its content is less than about 5 mol%, softness is insufficient, and if it exceeds about 18 mol%, resistance to cold flow is undesirably reduced.

The benzyl methacrylate (or benzyl acrylate) unit is necessary for improving the intimate adhesion of a resist and the resistance of a photosensitive layer to cold flow, and is present in an amount of from about 2 to 10 mol%. If its content is less than about 2 mol%, adhesion and resistance to cold flow are reduced. Contents exceeding about 10 mol% reduce the rate of development.

The methacrylic acid unit contributes to developability of a photosensitive layer with a weakly alkaine aqueous solution, and its content ranges from about 20 to 40 mol%. Development becomes difficult with a content less than about 20 mol%. On the other hand, if the content is more than about 40 mol%, the hardened resist image tends to have insufficient resistance to a weakly alkaline aqueous solution, resulting in defects in the resist image.

The weight average molecular weight of the polymer determines the rate of development and cold flow resistance of a photosensitive layer and ranges from about 10,000 to 500,000, preferably from about 50,000 to 250,000, and more preferably 70,000 to 150,000. When it is less than about 10,000, cold flow resistance is reduced. If it exceeds about 500,000, the rate of development decreases.

The binder according to the present invention is preferably used in an amount of from about 40 to 80% by weight, more preferably from about 50 to 70% by weight, and most preferably 55 to 65% by weight, based on the total weight of the photopolymerizable composition.

Specific but nonlimiting examples of the binder used in the present invention are shown in Table 1 below. The polymeric binders according to the present invention can be prepared by any polymerization techniques known in the art, as described, for example, in U.S. Pat. Nos. 3,804,631 and 4,284,707. The solvent used in the polymerization for producing the polymers of Table 1 was a 1:2 (by weight) mixture of 1-methoxy-2-propanol and methyl ethyl ketone.

TABLE 1

| Polymer No. | Monomer Composition (mol %) | | | | Weight Average Molecular Weight |
|---|---|---|---|---|---|
| | MM* | EHA** | BM*** | MA**** | |
| 1 | 55 | 11.7 | 4.5 | 28.8 | 80,000 |
| 2 | 55 | 6.7 | 4.5 | 33.8 | 79,000 |
| 3 | 60 | 6.7 | 4.5 | 28.8 | 85,000 |
| 4 | 65 | 6.7 | 4.5 | 23.8 | 82,000 |
| 5 | 50 | 11.7 | 4.5 | 33.8 | 79,000 |
| 6 | 50 | 16.7 | 4.5 | 28.8 | 78,000 |
| 7 | 60 | 11.7 | 4.5 | 23.8 | 80,000 |
| 8 | 45 | 16.7 | 4.5 | 33.8 | 78,000 |
| 9 | 55 | 8.1 | 8.1 | 28.8 | 80,000 |
| 10 | 55 | 4.5 | 11.7 | 28.8 | 81,000 |
| 11 | 55 | 11.7 | 4.5 | 28.8 | 120,000 |
| 12 | 55 | 11.7 | 4.5 | 28.8 | 90,000 |

Note: *Methyl methacrylate
**2-Ethylhexyl acrylate
***Polymer Nos. 1 to 11 are benzyl methacrylate and Polymer No. 12 is benzyl acrylate
****Methacrylic acid The polymerizable unsaturated compounds which can be used in the photopolymerizable compositions according to the present invention are addition-polymerizable compounds containing at least two ethylenically unsaturated double bonds per molecule. These compounds can be used either individually or in combinations f two or more thereof.

Specific examples of preferred polymerizable unsaturated compounds include acrylic or methacrylic esters of polyols as described in Japanese Patent Publication Nos. 5093/60, 14719/60 and 28727/69, e.g., diethylene glydol di(meth)acrylate, triethylene glycol di(meth)acrylate, tetraethylene glycol di(meth)acrylate, nonaethylene glycol di(meth)acrylate, pentaerythritol tri(meth)acrylate, trimethylolpropane tri(meth)acrylate, trimethylolpropane di(meth)acrylate, pentaerythritol tetra(meth)acrylate, dipentaerythritol penta(meth)acrylate, dipentaerythritol hexa(meth)acrylate, 1,6-hexanediol di(meth)acrylate, etc.; bis(meth)acrylamides, e.g., methylenebis(meth)acrylamide, ethylenebis(meth)acrylamide, m-xylylenebis(meth)acrylamide, etc.; and compounds having a urethane group, such as di(2-methacryloxyethyl)-2,4-tolylenediurethane, di(2-acryloxyethyl)hexamethylenediurethane, (meth)acrylurethane oligomers obtained by preliminarily reacting a polyol with a diisocyanate to prepare an isocyanate-terminated compound and then reacting the product with a β-hydroxyalkyl (meth)acrylate, such as an oligomer obtained by reacting 4 mols of 2,4-tolylene diisocyanate and 3 mols of ethylene glycol and reacting the product with 1 mol of β-hydroxyethyl acrylate, etc. Particularly, polypropylene glycol di(meth)acrylate, polyethylene glycol di(meth)acrylate, trimethylolpropane tri(meth)acrylate and pentaerythritol tetra(meth)acrylate are more preferred. The molecular weight of the polymerizable unsaturated compound preferably ranges from about 100 to 5,000 and more preferably about 300 to 2,000.

The content of the polymerizable unsaturated compound preferably ranges from about 7.5 to 55% by weight, more preferably from about 15 to 45% by weight, and most preferably 20 to 40% by weight, based on the total weight of the photopolymerizable composition.

The photopolymerization initiator which can be used in the composition of the invention may be any one or more of compounds capable of initiating polymerization of the above-recited polymerizable unsaturated compounds. It is preferable that the photopolymerization initiator or initiator system contain at least one component having a molecular extinction coefficient (measured in accordance with a method as described in Donald J. Pietrzyk and Clyde W. Frank, *Analytical Chemistry*, Academic Press, New York and London (1974)) of at least about 50 in a wavelength region of from about 3,000 to 8,000 Å, and more preferably from about 3,300 to 5,000 Å.

Specific and preferred examples of the photopolymerization initiators include aromatic ketones, e.g., benzophenone, 4,4'-bis(dimethylamino)benzophenone, 4,4'-bis(diethylamino)benzophenone, 4-methoxy-4'-dimethylaminobenzophenone, 4,4'-dimethoxybenzophenone, 4-dimethylaminobenzophenone, 4-dimethylaminoacetophenone, benzil, anthraquinone, 2-t-butylanthraquinone, 2-methylanthraquinone, phenanthraquinone, xanthone, thioxanthone, 2-chlorothioxanthone, 2,4-diethylthioxanthone, fluorenone, acridone, and benzoin; benzoic ethers, e.g., benzoin methyl ether, benzoin ethyl ether, benzoin propyl ether, benzoin isopropyl ether, and benzoin phenyl ether; 2,4,5-triarylimidazole dimers, e.g., a 2-(o-chlorophenyl)-4,5-diphenylimidazole dimer, a 2-(o-chlorophenyl)-4,5-di(m-methoxyphenyl)imidazole dimer, a 2-(o-fluorophenyl)-4,5-diphenylimidazole dimer, a 2-(o-methoxyphenyl)-4,5-diphenylimidazole dimer, and a 2-(p-methoxyphenyl)-4,5-diphenylimidazole dimer; polyhalogen compounds, e.g., carbon tetrabromide, phenyltribromomethylsulfone, and phenyltrichloromethyl ketone; the compounds disclosed in Japanese Patent Application (OPI) No. 133428/78, Japanese Patent Publication Nos. 1819/82 and 6096/82, and U.S. Pat. No. 3,615,455; and combinations of two or more of these compounds, such as a combination of a 2,4,5-triarylimidazole dimer and 2-mercaptobenzoxazole or Leuco Crystal Violet, a combination of 4,4'-bis(dimethylamino)benzophenone and benzophenone or benzoic methyl ether as disclosed in U.S. Pat. No. 3,427,161, a combination of benzoyl-N-methylnaphthothiazoline and 2,4-bis(trichloromethyl)-6,4-methoxyphenyltriazole as disclosed in U.S. Pat. No. 4,239,850, and a combination of dimethylthioxanthone and a 4-dialkylaminobenzoic acid ester as disclosed in Japanese Patent Application (OPI) No. 23602/82.

Particularly, a combination of 4,4'-bis(diethylamino)benzophenone and benzophenone, a combination of 2,4-diethylthioxanthone and ethyl 4-dimethylaminobenzoate and a combination of 4,4'-bis(diethylamino)benzophenone and 2,4,5-triarylimidazole dimer are more preferred.

These photopolymerization initiators or initiator systems are preferably used in an amount of from about 0.1 to 10% by weight, more preferably from about 0.2 to 6% by weight, and most preferably 2 to 6% by weight, based on the total weight of the photopolymerizable composition.

The photopolymerizable composition in accordance with the present invention essentially contains the above-described photopolymerization initiator, ethylenically unsaturated compound, and binder. If desired, the composition can further contain other conventional additives, such as thermal polymerization inhibitors, plasticizers, dyes, color-changing components, unifunctional ethylenically unsaturated compounds, agents for improving or promoting adhesion to a base surface (adhesion promoters), and the like. By appropriate selection of these additives, various performance properties of the resulting photoresist, such as photographic properties, printout properties, film properties, and the like, can be controlled.

The thermal polymerization inhibitor can be added to prevent the photopolymerizable composition from thermally polymerizing or polymerizing with the passage of time. Examples of suitable thermal polymerization inhibitors include p-methoxyphenol, hydroquinone, t-butyl catechol, pyrogallol, 2-hydroxybenzophenone, 4-methoxy-2-hydroxybenzophenone, cupric chloride, phenothiazine, chloranil, naphthylamine, β-naphthol, 2,6-di-t-butyl-p-cresol, nitrobenzene, dinitrobenzene, picric acid, p-toluidine, etc. The thermal polymerization inhibitor is preferably used in an amount of from 0.001 to 5% by weight, and more preferably from 0.01 to 1% by weight, based on the total weight of the photopolymerizable composition.

The plasticizer can be added to control film properties and includes phthalic esters, e.g., dibutyl phthalate, diheptyl phthalate, dioctyl phthalate, diallyl phthalate, etc.; glycol esters, e.g., triethylene glycol diacetate, tetraethylene glycol diacetate, etc.; phosphoric esters, e.g., tricresyl phosphate, triphenyl phosphate, etc.; amides, e.g., p-toluenesulfonamide, benzenesulfonamide, N-n-butylacetamide, etc.; aliphatic dibasic acid esters, e.g., diisobutyl adipate, dioctyl adipate, dimethyl sebacate, dioctyl azelate, dibutyl maleate, etc.; triethyl citrate, tributyl citrate, glycerin triacetyl ester, butyl laurate, dioctyl 4,5-diepoxycyclohexane-1,2-dicarboxylate, etc. The plasticizer is preferably used in an amount of from 0.1 to 20% by weight, and more preferably from 1 to 10% by weight, based on the total weight of the photopolymerizable composition.

The dyes that can suitably be added include Brilliant Green, Eosine, Ethyl Violet, Erythrosine B, Methyl Green, Crystal Violet, Basic Fuchsine, phenolphthalein, 1,3-diphenyltriazene, Alizarine Red S, Thymolphthalein, Methyl Violet 2B, Quinaldine Red, Rose Bengal, Metanil Yellow, Thymolsulfophthalein, Xylenol Blue, Methyl Orange, Orange IV, diphenyl thiocarbazone, 2,7-dichlorofluorescein, Paramethyl Red, Congo Red, Benzopurpurine 4B, α-Naphthyl Red, Nile Blue A, Phenacetolin, Methyl Violet, Malachite Green, Parafuchsine, Oil Blue #603 (a trade name of Orient Kagaku Kogyo K.K.), Victoria Pure Blue BOH (a trade name of Hodogaya Chemical Co., Ltd.; Ethanaminium, N-[4-{[4-(diethylamino)phenyl]-[4-(ethylamino)-1-naphthalenyl]methylene}-2,5-cyclohexadien-1-ylidene]-N-ethyl, chloride), Spiron Blue GN (a trade name of Hodogaya Chemical Co., Ltd.), Rhodamine B, Rhodamine 6G, etc. The dyes are preferably used in an amount of from 0.001 to 1.0% by weight, and preferably 0.01 to 0.1% by weight, based on the total weight of the photopolymerizable composition.

The color-changing agent is added so as to form a visible image on exposure to light. Examples of such color-changing agents include the above-enumerated dyes and, in addition, diphenylamine, dibenzylaniline, triphenylamine, diethylaniline, diphenyl-p-phenylenediamine, p-toluidine, 4,4'-biphenyldiamine, o-chloroaniline, p,p',p''-hexamethyltriaminotriphenylmethane, p,p'-tetramethyldiaminotriphenylmethane, p,p',p''-triaminotriphenylcarbinol, Leuco-Methyl Violet, etc. The color-changing agent is preferably used in an amount of from 0.01 to 10% by weight, and preferably 0.1 to 5% by weight, based on the total weight of the photopolymerizable composition.

The adhesion promoter that can be used includes the compounds described in Japanese Patent Publication No. 9177/75, e.g., benzimidazole, benzothiazole, benzoxazole, benzotriazole, etc.; and the compounds disclosed in Japanese Patent Application (OPI) No. 702/78, e.g., 2-mercaptobenzothiazole, 2-mercaptobenzimidazole, etc. The adhesion promoter is preferably used in an amount of from 0.001 to 1.0% by weight, and preferably 0.01 to 0.1% by weight, based on the total weight of the photopolymerizable composition.

The photopolymerizable composition according to the present invention is prepared by dissolving the above-described constituting components in a solvent, and the resulting coating composition is coated on an appropriate support by means of various coaters, such as a blade coater, a rod coater, a knife coater, a doctor roll coater, a comma coater, a reverse roll coater, a transfer roll coater, a gravure coater, a kiss roll coater, a curtain coater, an extrusion coater, etc., followed by drying it. Suitable solvents used include ethylene dichloride, monochlorobenzene, cyclohexanone, methyl ethyl ketone, acetone, methyl cellosolve acetate, ethyl acetate, methyl acetate, methyl cellosolve, 1-methoxy-2-propanol, toluene, xylene, and mixtures thereof. As a drying method in the case of using a combustible solvent, from the viewpoint of safety, a drier equipped with a heat source of the type of using air heated by steam is preferably used in accordance with a method of countercurrently contacting the heated air or a method of flowing the heated air through nozzle. The drier may be suitably selected from an arch type drier, a flat type drier, etc., in accordance with the purposes.

The photopolymerizable compositions of the present invention are particularly suitable as a photoresist layer of a dry film resist. They are also useful in additional applications, such as a photosensitive layer of a lithographic presensitized printing plate, films for photomasks, color proofs, films for overhead projectors, and films for intermediates.

When the composition of the invention is used as a photoresist, the photoresist layer preferably has a thickness of from about 0.1 to 500 μm, and more preferably from about 1 to 200 μm. When it is applied to the production of a lithographic presensitized printing plate, it is usually coated to a dry coverage of from about 0.1 to 10.0 g/m², and preferably from about 0.5 to 5.0 g/m².

When the photopolymerizable composition is employed as a dry film resist, a suitable support is selected from films of polyamides, polyolefins, polyesters, vinyl polymers, cellulose esters, and the like having a thickness in the range of from about 3 to 100 μm. A particularly preferred support film is a transparent polyethylene terephthalate film having a thickness of from about 10 μm to 25 μm. A protective film to be used in this application preferably includes a polyolefin film, and more particularly a polyethylene film of from about 20 to 25 μm in thickness.

When the photopolymerizable composition of the invention is applied to the production of films for photomasks, suitable supports include a polyethylene terephthalate film on which aluminum, an aluminum alloy or chromium is deposited and a polyethylene terephthalate film having a colored layer.

When the photopolymerizable composition of the invention is used as a photosensitive layer of a presensitized printing plate, the support therefor preferably includes aluminum plates having been rendered hydrophilic, such as a silicate-treated aluminum plate, an anodically oxidized aluminum plate, a grained aluminum plate, a silicate-electrodeposited aluminum plate and, in addition, a zinc plate, a stainless steel plate, a chromium-treated copper plate, plastic films having been rendered hydrophilic, and paper.

Further, when the composition of the invention is used for the production of color proofs for printing, films for overhead projectors, and films for intermediates, the support therefor includes transparent films, e.g., a polyethylene terephthalate film, a cellulose triacetate film, etc., whose surface may be roughened chemically or physically.

The photopolymerizable composition according to the present invention can be developed with a weakly alkaline aqueous solution (preferably pH 7.1 to 13, and more preferably pH 9 to 12) which may contain a small amount, usually about 20% by weight or less, of a watermiscible organic solvent. The development can be preferably carried out for 10 to 200 seconds at a temperature of 10° to 60° C. Suitable bases to be added to the developing solution are selected from hydroxides, carbonates, bicarbonates, silicates, phosphates, pyrophosphates, and acetates of alkali metals, ammonium or quaternary ammonium, and amines. Specific examples of these bases include lithium hydroxide, sodium hydroxide, potassium hydroxide, ammonium hydroxide, trimethylbenzylammonium hydroxide, sodium carbonate, potassium carbonate, sodium hydrogencarbonate, potassium hydrogencarbonate, sodium silicate, sodium phosphate, potassium phosphate, sodium pyrophosphate, sodium acetate, diethanolamine, triethanolamine, and so on. Of these, an aqueous solution containing about 1 to 2% by weight of sodium carbonate is particularly preferred.

It is surprising that the photopolymerizable compositions containing the specific binder according to the present invention exhibit plasticity in film formation, excellent adhesion to a base, resist strippability, as well as high image reproducibility and high resolving power. By virtue of these characteristics, the compositions of this invention make it possible to mill chemically the substrates with high precision.

Further, the compositions of the present invention are sufficiently resistant to cold flow that photoresists with low tackiness surface can be obtained. Furthermore, the excellent adhesion to a base assures sufficient resist properties during etching with conventional etching solutions, such as a ferric chloride aqueous solution and an ammonium persulfate aqueous solution, or during plating with conventional plating solutions, such as a solder, a copper pyrophosphate plating bath, a copper sulfate plating bath, and an acid gold plating bath.

The photopolymerizable compositions according to this invention are superior in the following points as compared with the conventional compositions. The following characteristics can be obtained at the same time in a well-balanced combination.

(1) Since the photosensitive layer has a good softness, chips due to trimming by a cutter after laminating on a copper base does not occur.

(2) Since the flowability is high, the excellent adhesion to a surface (usually rough surface) of a copper base can be obtained during thermal contact bonding.

(3) The releasing of a resist with a strong alkaline aqueous solution can be carried out at a high speed.

(4) Since the increase in line width is small, the image reproducibility and high resolving power can be obtained.

(5) The unexposed area is dissolved at a high speed during the development with a weakly alkaline aqueous solution.

(6) The steric quality of a resist image is good.

(7) Since the strength of the covers is high, the covers are hardly broken during the development of etching processings.

The present invention will now be illustrated in greater detail by the following Examples and Comparative Examples, but the present invention is not to be construed as being limited thereto. In these Examples all parts, ratios and percents are by weight unless otherwise indicated.

EXAMPLES 1 TO 12 AND COMPARATIVE EXAMPLES 1 TO 9

A photosensitive coating composition was prepared according to the following formulation, in which the binder was selected from among the polymers shown in Table 1 and comparative polymers listed in Table 2 given below.

| Photosensitive Composition Formulation: | |
|---|---|
| Binder (35% solution in the solvent used for polymerization) | 42.9 g |
| Ethyl Michler's Ketone | 0.04 g |
| Benzophenone | 0.45 g |
| Tribromomethylphenylsulfone | 0.15 g |
| Polypropylene Glycol Diacrylate (molecular weight: 822) | 7.0 g |
| Polyethylene Glycol Diacrylate (molecular weight: 742) | 2.0 g |
| 3,6-Bis(diphenylamino)fluoran | 0.09 g |
| 1-Phenyl-3-morpholinomethyl-1,3,4-triazole-2-thione | 0.01 g |
| Victoria Pure Blue BOH | 0.01 g |

The coating composition was coated on a 25 μm thick polyethylene terephthalate film with a rod coater to a dry film thickness of about 50 μm and dried in an oven at 100° C. for 2 minutes. The resulting photosensitive material was laminated on a cleaned and dried copper-clad base with the coated layer contacting the copper surface at 120° C. using an A24 Model Laminator (manufactured by Du Pont).

The photosensitive layer was exposed to light at an exposure of 140 mJ/cm$^2$ using a both-side exposing device using a 3 kw ultrahigh pressure mercury lamp ("HMW-6-N" manufactured by Oak Co., Ltd.) through a wiring pattern mask having 100 μm wide transparent wiring patterns in high contrast to an opaque background. The polyethylene terephthalate film was stripped off, and the photosensitive layer in the unexposed areas was removed by spraying 1.5 kg/cm$^2$ of a 1% aqueous solution of sodium carbonate at 30° C. to obtain a resist line image. The time of development was determined by measuring a time taken until the photosensitive layer was first dissolved by the above spraying step. The image quality (e.g., defects of lines) was visually evaluated, and the increase in line width was measured.

A resist image was formed in the same manner as described above, except for replacing the wiring pattern mask with a standard resolving power chart. The width of the thinnest distinguishable line was determined to evaluate resolving power.

A resist film was laminated onto both sides of a base 1.6 mm thick laminated on both surfaces with copper 36 μm thick having 100 holes therethrough each 2.5 mm in diameter, in the same manner as described above. The photosensitive layer was then exposed to light in the same manner as described above, except for using a mask having transparent circular patterns of 3.0 mm in diameter in the opaque background corresponding to the openings of the holes through the base. The unexposed area was removed in the same manner as described above to form covers, each of which covered each of the 100 openings of the holes. In order to evaluate the strength of the covers, the surface of the base having covers thereon was sprayed with 5 kg/cm$^2$ of hot water at 54° C. for 8 minutes, and the number of cover remaining on the base was counted to determine a percentage of cover retention (%).

A photosensitive layer on a copper-clad base was exposed to light through a wiring pattern in the same manner as described above. The exposed copper surface in the area uncovered with the resist image was etched out by spraying 1.5 kg/cm$^2$ of a 35% aqueous solution of ferric chloride at 40° C. until the exposed copper layer was completely removed. The etched base was washed with water and dried to obtain a copper wiring pattern covered with the resist. The resist was immersed in a 3% aqueous solution of potassium hydroxide at 50° C., and the time required for the resist to peel off from the copper surface (peeling time) was determined.

The results of these tests are shown in Table 3.

TABLE 2

Comparative Polymers

| Polymer No. | Monomer Composition | | Polymerization Solvent | Weight Average Molecular Weight |
|---|---|---|---|---|
| | Monomer | Mol % | | |
| 13 | Methyl methacrylate | 60 | 1-Methoxy-2-propanol/methyl ethyl ketone (1/2 by weight) | 78,000 |
| | Methacrylic acid | 40 | | |
| 14 | Benzyl methacrylate | 60 | 1-Methoxy-2-propanol/methyl ethyl ketone (1/2 by weight) | 85,000 |
| | Methacrylic acid | 40 | | |
| 15 | Methyl methacrylate | 55 | 1-Methoxy-2-propanol/methyl ethyl ketone (1/2 by weight) | 81,000 |
| | 2-Ethylhexyl acrylate | 16.2 | | |
| | Methacrylic acid | 28.8 | | |
| 16 | Methyl methacrylate | 55 | 1-Methoxy-2-propanol/methyl ethyl ketone (1/2 by weight) | 79,000 |
| | Benzyl methacrylate | 16.2 | | |
| | Methacrylic acid | 28.8 | | |
| 17 | Methyl methacrylate | 55 | Ethyl cellosolve | 110,000 |
| | 2-Ethylhexyl acrylate | 11.7 | | |
| | n-Butyl methacrylate | 4.5 | | |
| | Methacrylic acid | 28.8 | | |
| 18 | Cyclohexyl methacrylate | 20 | Methyl cellosolve/methyl ethyl | 130,000 |
| | Methyl acrylate | 40 | | |

TABLE 2-continued

Comparative Polymers

| Polymer No. | Monomer Composition | | Polymerization Solvent | Weight Average Molecular Weight |
|---|---|---|---|---|
| | Monomer | Mol % | | |
| | Methacrylic acid | 30 | ketone (1/1 by weight) | |
| | Acrylic acid | 10 | | |
| 19 | Benzyl methacrylate | 50 | Methyl cellosolve/ methyl ethyl ketone (1/1 by weight) | 105,000 |
| | Methyl acrylate | 10 | | |
| | Methacrylic acid | 20 | | |
| | Acrylic acid | 20 | | |
| 20 | Benzyl methacrylate | 50 | Methyl cellosolve/ methyl ethyl ketone (1/1 by weight) | 100,000 |
| | Methacrylic acid | 30 | | |
| | Acrylic acid | 20 | | |
| 21 | Benzyl acrylate | 30 | Methyl cellosolve/ methyl ethyl ketone (1/1 by weight) | 110,000 |
| | Methyl methacrylate | 30 | | |
| | methacrylic acid | 40 | | | oven at 100° C. for 2 minutes to form a photosensitive layer.

| Coating Composition Formulation: | |
|---|---|
| 2,4-Diethylthioxanthone | 0.1 g |
| Ethyl 4-N,N-dimethylaminobenzoate | 0.2 g |
| Ethyl Michler's Ketone | 0.04 g |
| Benzophenone | 0.45 g |
| Polypropylene Glycol Diacrylate (molecular weight: 822) | 7.0 g |
| Polyethylene Glycol Diacrylate (molecular weight: 742) | 2.0 g |
| 3,6-Bis(diphenylamino)fluoran | 0.09 g |
| Tribromomethylphenylsulfone | 0.15 g |
| 1-Phenyl-3-morpholinomethyl-1,3,4-triazole-2-thione | 0.01 g |
| Victoria Pure Blue BOH | 0.008 g |
| Polymer No. 1 (35% solution in 1-methoxy-2-propanol/methyl ethyl ketone (1/2 by weight)) | 42.9 g |

The resulting dry film resist was laminated on a copper-clad base in the same manner as in Example 1. A stepwedge having an optical density intervals of 0.15 was intimately contacted with the resist film, and the

TABLE 3

| Example No. | Polymer No. | Softness of Photosensitive Layer | Time of Development (sec) | Increase of Line Thickness (μm) | Resolving Power (μm) | Resist Image Quality | Cover Retention (%) | Peeling Time (sec) |
|---|---|---|---|---|---|---|---|---|
| Example 1 | 1 | Good | 34 | 10 | 50 | Good | 98 | 71 |
| Example 2 | 2 | " | 37 | 4 | 50 | " | 98 | 80 |
| Example 3 | 3 | " | 36 | 7 | 50 | " | 98 | 75 |
| Example 4 | 4 | " | 50 | 13 | 50 | " | 95 | 61 |
| Example 5 | 5 | " | 25 | 3 | 50 | " | 97 | 80 |
| Example 6 | 6 | " | 30 | 11 | 50 | " | 98 | 60 |
| Example 7 | 7 | " | 43 | 13 | 50 | " | 95 | 52 |
| Example 8 | 8 | " | 25 | 7 | 50 | " | 95 | 67 |
| Example 9 | 9 | " | 38 | 12 | 50 | " | 95 | 53 |
| Example 10 | 10 | " | 50 | 12 | 50 | " | 95 | 74 |
| Example 11 | 11 | " | 47 | 10 | 50 | " | 99 | 72 |
| Example 12 | 12 | " | 33 | 10 | 50 | " | 99 | 72 |
| Comparative Example 1 | 13 | Poor | 32 | 8 | 80 | Poor | 70 | 126 |
| Comparative Example 2 | 14 | " | 56 | 11 | 80 | Good | 98 | 118 |
| Comparative Example 3 | 15 | Good | 36 | 7 | 80 | " | 95 | 82 |
| Comparative Example 4 | 16 | Poor | 56 | 12 | 70 | " | 97 | 74 |
| Comparative Example 5 | 17 | Good | 45 | 13 | 70 | " | 95 | 87 |
| Comparative Example 6 | 18 | Poor | 60 | 8 | 50 | " | 98 | 130 |
| Comparative Example 7 | 19 | " | 50 | 10 | 50 | " | 98 | 120 |
| Comparative Example 8 | 20 | " | 45 | 5 | 50 | " | 97 | 110 |
| Comparative Example 9 | 21 | Good | 55 | 8 | 50 | " | 98 | 180 |

As can be seen from Table 3, the photopolymerizable compositions using the polymer according to the present invention as a binder show high rates of development, satisfactory resist image quality, excellent reproducibility, and high resolving power. Further, the compositions have high cover retention strength and satisfactory peeling time.

EXAMPLE 13

A photosensitive coating composition having the following formulation was prepared, coated on a 25 μm thick polyethylene terephthalate film with a rod coater to a dry film thickness of about 50 μm, and dried in an photosensitive layer was exposed to light at 80 mJ/cm² using the same mercury lamp as in Example 1. After the polyethylene terephthalate film was stripped away, 1.5 kg/cm² of a 1% aqueous solution of sodium carbonate at 30° C. was sprayed thereon over 1 minute to dissolve and remove the resist film in the unexposed areas. It was found that the image of the stepwedge up to the 8th step (i.e., a density of 1.2) had been hardened.

Further, a resist image of a wiring pattern obtained by using the photopolymerizable composition of this example showed a resolving power of 50 μm and excellent reproducibility of line width, as well as sufficient resistance to a ferric chloride etching solution, a copper sulfate plating solution, a copper pyrophosphoric acid plating solution, and a solder bath.

While the invention has been described in detail and with reference to specific embodiments thereof, it will be apparent to one skilled in the art that various changes and modifications can be made therein without departing from the spirit and scope thereof.

What is claimed with:

1. A photopolymerizable composition consisting essentially of an addition polymerizable unsaturated compound having at least two ethylenically unsaturated double bonds in the molecule, a photopolymerization initiator, and a binder, wherein said binder is a tetrapolymer having a weight average molecular weight of from about 10,000 to 500,000 represented by formula (I):

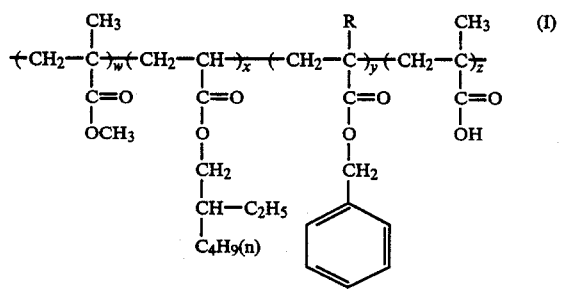

wherein R represents a hydrogen atom or a methyl group; and w, x, y and z each represents mol percent, w ranging from about 45 to 65; x ranging from about 5 to 18; y ranging from about 2 to 10; and z ranging from about 20 to 40, $C_4H_9(n)$ represents an n-butyl group, wherein said binder is present in an amount of from about 40 to 80% by weight based on the total weight of said composition, wherein said polymerizable unsaturated compound is present in an amountof from about 7.5 to 55% by weight based on the total weight of said composition and wherein said photopolymerization initiator is present in an amount of from about 0.1 to 10% by weight based on the total weight of said composition.

2. A photopolymerizable composition as in claim 1, wherein said tetrapolymer has a weight average molecular weight of from about 50,000 to 250,000.

3. A photopolymerizable composition as in claim 1, wherein said binder is present in an amount of from about 50 to 70% by weight based on the total weight of said composition.

4. A photopolymerizable composition as in claim 1, wherein said polymerizable unsaturated compound is present in an amount of from about 15 to 45% by weight based on the total weight of said composition.

5. A photopolymerizable composition as in claim 1, wherein said photopolymerization initiator contains a component having a molecular extinction coefficient of at least about 50 in the wavelength region of from about 3,000 to 8,000 Å.

6. A photopolymerizable composition as in claim 5, wherein said photopolymerization initiator contains a component having a molecular extinction coefficient of at least about 50 in the wavelength region of from about 3,300 to 5,000 Å.

7. A photopolymerizable composition as in claim 1, wherein said photopolymerization initiator is present in an amount of from about 0.2 to 6% by weight based on the total weight of said composition.

8. A photopolymerizable composition as in claim 1, wherein said polymerizable unsaturated compound is selected from the group consisting of an acrylic polyol ester, a methacrylic polyol ester, a bis(meth)acrylamide, and a compound containing a urethane group.

9. A photopolymerizable composition as in claim 1, wherein said photopolymerization initiator is selected from the group consisting of an aromatic ketone, a benzoin ether, a 2,4,5-triarylimidazole dimer, and a polyhalogenated compound, and combinations thereof.

10. A photoresist comprising a support having thereon a photoresist layer comprising a photopolymerizable composition consisting essentially of an addition polymerizable unsaturated compound having at least two ethylenically unsaturated double bonds in the molecule, a photopolymerization initiator, and a binder, wherein said binder is a tetrapolymer having a weight average molecular weight of from about 10,000 to 500,000 represented by formula (I):

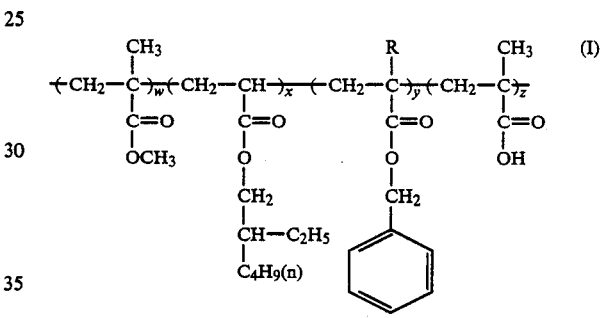

wherein R represents a hydrogen atom or a methyl group; and w, x, y and z each represents mol percent, w ranging from about 45 to 65; x ranging from about 5 to 18; y ranging from about 2 to 10; and z ranging from about 20 to 40, $C_{49}(n)$ represents an n-butyl group, wherein said binder is present in an amount of from about 40 to 80% by weight based on the total weight of said composition, wherein said polymerizable unsaturated compound is present in an amount of from about 7.5 to 55% by weight based on the total weight of said composition and wherein said photopolymerization initiator is present in an amount of from about 0.1 to 10% by weight based on the total weight of said composition.

11. A photoresist as in claim 10, wherein said photoresist layer has a thickness of from about 0.1 to 500 μm.

12. A photoresist as in claim 11, wherein said photoresist layer has a thickness of from about 1 to 200 μm.

13. A lithographic presensitized printing plate comprising a support having thereon a photosensitive layer comprising a photopolymerizable composition consisting essentially of an addition polymerizable unsaturated compound having at least two ethylenically unsaturated double bonds in the molecule, a photopolymerization initiator, and a binder, wherein said binder is a tetrapolymer having a weight average molecular weight of from about 10,000 to 500,000 represented by formula (I):

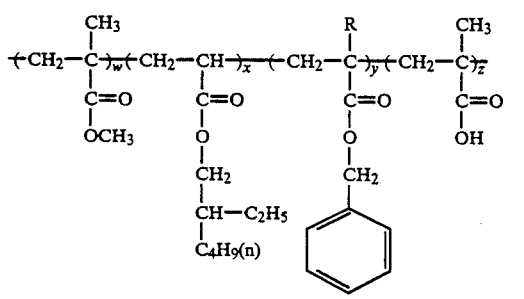

wherein R represents a hydrogen atom or a methyl group; and w, x, y and z each represents mol percent, w ranging from about 45 to 65; x ranging from about 5 to 18; y ranging from about 2 to 10; and z ranging from about 20 to 40, $C_4H_9(n)$ represents an n-butyl group, wherein said binder is present in an amount of from about 40 to 80% by weight based on the total weight of said composition, wherein said polymerizable unsaturated compound is present in an amount of from about 7.5 to 55% by weight based on the total weight of said composition and wherein said photopolymerizaton initiator is present in an amount of from about 0.1 to 10% by weight based on the total weight of said composition.

14. A lithographic presensitized printing plate as in claim 13, wherein said photosensitive layer comprises said photopolymerizable composition in a dry amount of from about 0.1 to 10.0 g/m².

15. A photoresist as in claim 10, wherein said support is a polyethylene terephthalate film having the thickness of from about 10 μm to 25 μm.

* * * * *